United States Patent
Hârle et al.

(10) Patent No.: US 8,502,264 B2
(45) Date of Patent: Aug. 6, 2013

(54) COMPOSITE SUBSTRATE, AND METHOD FOR THE PRODUCTION OF A COMPOSITE SUBSTRATE

(75) Inventors: Volker Hârle, Laaber (DE); Uwe Strauss, Bad Abbach (DE); Georg Brüderl, Burglengenfeld (DE); Christoph Eichler, Tegernheim (DE); Adrian Avramescu, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 273 days.

(21) Appl. No.: 12/298,723

(22) PCT Filed: Apr. 20, 2007

(86) PCT No.: PCT/DE2007/000725
§ 371 (c)(1),
(2), (4) Date: Feb. 2, 2009

(87) PCT Pub. No.: WO2007/121735
PCT Pub. Date: Nov. 1, 2007

(65) Prior Publication Data
US 2009/0206348 A1    Aug. 20, 2009

(30) Foreign Application Priority Data

Apr. 25, 2006 (DE) .................... 10 2006 019 110

(51) Int. Cl.
*H01L 33/02* (2010.01)
(52) U.S. Cl.
USPC ............ 257/103; 257/E33.06; 156/153
(58) Field of Classification Search
USPC ............... 257/103, E31.11, E31.119, E31.12, 257/E33.055, E33.06; 156/153, 247; 216/38; 428/688
See application file for complete search history.

(56) References Cited

U.S. PATENT DOCUMENTS 5,374,564 A   12/1994   Bruel
6,150,564 A   11/2000   Brocker et al.
(Continued)

FOREIGN PATENT DOCUMENTS

DE   10 2005 052 358   3/2007
DE   10 2006 007 293   8/2007
(Continued)

OTHER PUBLICATIONS

Dictionary.com, "epitaxy," in Collins English Dictionary—Complete & Unabridged 10th Edition. Source location: HarperCollins Publishers. http://dictionary.reference.com/browse/epitaxy. Available: http://dictionary.reference.com. Accessed: Apr. 16, 2012.*
I. Schnitzer et al., "30% external quantum efficiency from surface textured, thin-film light-emitting diodes", Appl. Phys. Lett. vol. 63, No. 16, pp. 2174-2176, Oct. 18, 1993.
English Translation of Taiwanese Office Action.

*Primary Examiner* — Wensing Kuo
(74) *Attorney, Agent, or Firm* — Cozen O'Connor

(57) ABSTRACT

A composite substrate (1) comprising a substrate body (2) and a utility layer (31) fixed on the substrate body (2). A planarization layer (4) is arranged between the utility layer (31) and the substrate body (2). A method for producing a composite substrate (1) applies a planarization layer (4) on a provided utility substrate (3). The utility substrate (3) is fixed on a substrate body (2) for the composite substrate (1). The utility substrate (3) is subsequently separated, wherein a utility layer (31) of the utility substrate (3) remains for the composite substrate (1) on the substrate body (2).

21 Claims, 5 Drawing Sheets

U.S. PATENT DOCUMENTS

| | | | |
|---|---|---|---|
| 6,548,335 B1 * | 4/2003 | Huster et al. | 438/197 |
| 6,768,175 B1 * | 7/2004 | Morishita et al. | 257/352 |
| 6,890,835 B1 | 5/2005 | Chu et al. | |
| 6,936,482 B2 * | 8/2005 | Auberton-Herve | 438/14 |
| 2002/0089016 A1 | 7/2002 | Joly et al. | |
| 2004/0033638 A1 * | 2/2004 | Bader et al. | 438/46 |
| 2004/0241975 A1 * | 12/2004 | Faure et al. | 438/607 |
| 2005/0104067 A1 | 5/2005 | Chu et al. | |
| 2005/0164419 A1 * | 7/2005 | Hirota et al. | 438/46 |
| 2005/0269671 A1 | 12/2005 | Faure et al. | |
| 2006/0048702 A1 * | 3/2006 | Son et al. | 117/94 |
| 2006/0060888 A1 * | 3/2006 | Kim et al. | 257/200 |
| 2007/0175384 A1 | 8/2007 | Bruderl et al. | |

FOREIGN PATENT DOCUMENTS

| | | |
|---|---|---|
| FR | 2 787 919 | 6/2000 |
| JP | 2004-512683 | 4/2004 |
| TW | 271843 | 1/2007 |
| TW | 200644747 | 5/2007 |
| WO | WO 02/33746 | 4/2002 |
| WO | WO 02/43112 | 5/2002 |
| WO | WO 03/105219 | 12/2003 |
| WO | WO 2006/000691 | 1/2006 |
| WO | WO 2007/025497 | 3/2007 |

* cited by examiner

COMPOSITE SUBSTRATE, AND METHOD FOR THE PRODUCTION OF A COMPOSITE SUBSTRATE

RELATED APPLICATIONS

This is a U.S. national stage under 35 USC §371 of application No. PCT/DE2007/000725, filed on Apr. 20, 2007.

This application claims the priority of German application no. 10 2006 019 110.2 filed Apr. 25, 2006, the entire content of which is hereby incorporated by reference.

FIELD OF THE INVENTION

The invention relates to a composite substrate and to a method for producing such a substrate.

BACKGROUND OF THE INVENTION

High-quality substrates are necessary for numerous optoelectronic components, in particular semiconductor chips, for example semiconductor chips based on III-V semiconductor material, for instance based on GaN. Since these substrates are in some instances highly cost-intensive, it is expedient to repeatedly transfer a thin layer of this first, high-quality (master) substrate to more cost-effective secondary substrates. One possible method in this respect involves producing a separation zone, for example a lateral fracture nucleation zone, for example by implantation into the master substrate, wafer bonding with a secondary substrate and splitting the master substrate at the separation or fracture nucleation zone, wherein the topmost utility layer of the master substrate remains fixedly connected to the secondary substrate.

However, the method described above exhibits limitations in terms of practical implementation. Thus, different thermal expansion of master substrate and secondary substrate and also wafer bow and warp impose stringent requirements on the adhesive force during the connection process.

SUMMARY OF THE INVENTION

It is an object of the invention to specify an improved composite substrate and a corresponding production method. Furthermore, it is an object to specify an associated production method for a semiconductor chip.

A method is specified in which the bonding stability is increased in such a way that the requirements imposed on the master substrate with regard to wafer roughness or planarity, but also with regard to wafer bow and undulation can be reduced. In particular, the bonding stability is improved for high surface roughnesses, for example greater than 0.1 nm, for instance 0.5 nm to 10 nm.

A method according to the invention for producing a composite substrate involves providing a utility substrate. A planarization layer is applied to the utility substrate. The utility substrate is fixed on a substrate body for the composite substrate, wherein the planarization layer faces the substrate body. The utility substrate is subsequently separated, wherein a utility layer of the utility substrate remains for the composite substrate on the substrate body.

The utility layer is provided in particular for the deposition of a semiconductor layer or of a semiconductor layer sequence for a, preferably electronic or optoelectronic, semiconductor component. That part of the utility substrate which is separated from the composite substrate can be reused. A cost-intensive utility substrate, for instance a substrate which contains GaN or consists of GaN, can thus be used for producing a plurality of composite substrates. The composite substrate therefore can be distinguished by comparatively low costs in conjunction with high crystal quality of the utility layer.

A material adapted to the utility substrate with regard to its coefficient of thermal expansion is preferably chosen for the substrate body. A mechanically stable connection between the substrate body and the utility substrate which in particular withstands even severe temperature fluctuations can be simplified as a result.

The substrate body can, for example, contain sapphire, silicon, SiC, GaAs or GaN or consist of such a material.

An intermediate process or a plurality of intermediate processes can be inserted in order to improve the method for transferring crystal layers to a secondary substrate, for example by means of lateral fracture nucleation and wafer bonding. The applicability of the method is advantageously extended by means of such an intermediate process or by means of such intermediate processes. An intermediate process of this type is for example applying the planarization layer on the utility substrate. The planarization layer is also referred to as smoothing layer.

The planarization layer can also comprise two or more partial layers.

The planarization layer or at least one partial layer of the planarization layer can be produced for example by means of spinning-on or by means of a PVD (physical vapor deposition) method such as sputtering, for example silicon sputtering, preferably with subsequent polishing. A CVD (chemical vapor deposition) method can also be used for production.

Particularly preferably, the planarization layer or partial layer of the planarization layer that is produced by one of the methods mentioned is dielectric. Furthermore, said planarization layer or partial layer of the planarization layer is preferably formed in such a way that it can be smoothed in a simplified manner in a subsequent, preferably mechanical, step. Particularly preferably, the planarization layer contains a silicon nitride, such as SiN, a silicon oxynitride, such as SiON, a transparent conductive oxide (TCO) such as ITO, ZnO, SnO or $SnO_2$, or a silicon oxide, such as $SiO_2$.

The resulting roughness is preferably less than or equal to 5 nm, particularly preferably less than or equal to 1 nm. In case of doubt, roughness is understood to mean the root-mean-square roughness, also referred to as rms roughness. By way of example, the rms roughness can be determined by an atomic force microscopy (AFM) method.

Alternatively or supplementarily, the master substrate can be smoothed epitaxially, preferably by means of process parameters which promote lateral growth, for example, GaN-MOVPE at relatively high temperatures for example above 1000° C. The planarization layer or at least one partial layer of the planarization layer can therefore be deposited by means of an epitaxy method, for example MOVPE (metalorganic vapor phase epitaxy) or MBE (molecular beam epitaxy).

The planarization layer can be formed for leveling the surface of the utility substrate (master substrate). In particular, it is possible to reduce the roughness of that surface of the planarization layer which is remote from the utility layer or the utility substrate relative to that surface of the utility layer or utility substrate which faces the planarization layer. By means of the planarization layer, therefore, that surface of the composite comprising planarization layer and utility substrate which faces the substrate body for fixing can have a lower roughness. The fixing of the utility substrate to the substrate carrier can thus be simplified by means of the planarization layer.

Preferably, the utility substrate is bonded on to the substrate body, in particular by means of direct bonding A bonding connection is therefore formed between the substrate body and the utility substrate, in particular between the substrate body and the planarization layer.

In contrast to eutectic bonding, the connection partners during direct bonding are held together on account of atomic forces. Therefore, the formation of a metallic alloy is not necessary for the production of the bonding connection during direct bonding.

On account of the planarization layer, the direct bonding for fixing the utility substrate to the substrate body advantageously can also be applied to the utility substrate whose surface would be too rough and/or too uneven for reliably forming a direct bonding connection without such a planarization layer.

In a further preferred configuration, the utility substrate is smoothed, for example mechanically and/or chemically, before being fixed to the substrate body. In particular, the utility substrate can be smoothed by polishing, grinding, lapping or etching.

Furthermore, the utility substrate is preferably smoothed before the planarization layer is applied.

In a further preferred configuration a bonding auxiliary layer is applied. The bonding auxiliary layer is preferably an oxide layer and can for example contain a silicon oxide, such as $SiO_2$, a silicon oxynitride, such as SiON, or a TCO material such as ITO (indium tin oxide), ZnO, SnO or $SnO_2$, or consist of such a material. Alternatively, or supplementarily, the bonding auxiliary layer can contain a silicon nitride, such as SiN, or consist of such a material. A mechanically stable fixing of the utility substrate to the substrate body can be produced in a simplified manner by means of the bonding auxiliary layer.

The deposition of the bonding auxiliary layer is preferably effected at high temperatures, for example, >300° C. At high temperatures, layers can be deposited with a high density in a simplified manner. As a result, the formation of a bonding connection can be improved more extensively by means of the bonding auxiliary layer.

In one embodiment variant, the planarization layer is formed as bonding auxiliary layer. The planarization layer and bonding auxiliary layer can therefore be identical, wherein the relevant layer has both planarizing properties and properties that support the bonding in this case.

In an alternative embodiment variant, the bonding auxiliary layer is arranged between the substrate body and the planarization layer. In this embodiment variant, therefore, the bonding auxiliary layer is formed in addition to the planarization layer.

In a further embodiment variant, the bonding auxiliary layer, or, if appropriate, a further bonding auxiliary layer is applied to the substrate body.

A mechanically stable connection between the substrate body and the utility substrate can be produced in a simplified manner by means of the bonding auxiliary layer and if appropriate, by means of the further bonding auxiliary layer.

In one preferred configuration, a separation zone, also referred to as separation layer, is formed in the utility substrate. The separation zone preferably runs in a lateral direction, that is to say along a main extension direction of the utility substrate.

The utility substrate is preferably separated along this separation zone. The separation zone can therefore be used to establish the location at which the utility layer is separated from the utility substrate.

The separation zone is preferably formed in such way that a targeted separation of the utility substrate can be produced in a simple and reliable manner.

Preferably, the separation is induced thermally, for instance by means of heat treatment, mechanically or by means of radiation, for instance laser radiation.

The separation zone can be produced for example by means of implanting a substance for fracture nucleation, for instance by means of atoms or ions such as H+, HH+ or boron.

The separation zone can be formed before, after or during the fixing of the utility substrate on the substrate body.

In one preferred development, the separation zone is not formed until after the planarization layer has been applied. For this purpose, by way of example, the substance for fracture nucleation is not implanted until after the planarization, wherein the implantation is preferably effected through the planarization layer. A particularly level separation zone can advantageously be formed in this way.

In a further preferred configuration, before the utility substrate is fixed on the substrate body, microseparation nuclei are formed, preferably along the separation zone. Said microseparation nuclei can be microcracks, for example, which are formed between the utility layer and the remaining part of the utility substrate. Said microseparation nuclei promote later separation of the utility substrate, in particular along the separation zone. However, the microseparation nuclei are preferably embodied in such a way that a sufficiently mechanically stable connection between the utility layer and the remaining part of the utility substrate still remains before the later separation of the utility substrate.

A master substrate with slight off-orientation is preferably used. In the case of such a utility substrate, the surface of the utility substrate is tilted relative to a plane defined by principal crystal directions. Substrates of this type can be distinguished by a smooth surface.

In one preferred development, a surface of the utility layer which is remote from the substrate body is optimized for the deposition of a semiconductor layer sequence on said surface. This can be done mechanically or chemically, in particular by means of etching. Roughnesses or unevennesses which can occur during the separation of the utility substrate along the separation zone can advantageously be reduced in this way.

In the case of a completed composite substrate, the utility layer is fixed on the substrate body, wherein a planarization layer is preferably arranged between the utility layer and the substrate body.

The composite substrate is preferably provided for the deposition of a semiconductor layer or of a semiconductor layer sequence on the utility layer. Particularly preferably, the composite substrate is provided for the deposition of a semiconductor layer or semiconductor layer sequence that is based on a nitride compound semiconductor.

In the present context "based on nitride compound semiconductors" means that the active epitaxial layer sequence or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can have one or more dopants and additional constituents which essentially do not change the characteristic physical properties of the $Al_nGa_mIn_{1-n-m}N$ materials. For the sake of simplicity, however, the above formula only comprises the essential constituents of the crystal lattice (Al, Ga, In, N), even if these can be replaced in part by small quantities of further substances.

On account of the high crystal quality of the utility layer of the composite substrate it is possible to produce electronic or optoelectronic semiconductor chips with high quality. In the case of an electronic semiconductor chip, preferably a semiconductor layer or a semiconductor layer sequence for an electronic component or for an electronic circuit is arranged on the composite substrate.

An optoelectronic semiconductor chip preferably comprises a semiconductor layer sequence arranged on the composite substrate and having an active region suitable for generating radiation and/or for receiving radiation.

In particular, the composite substrate is particularly suitable for producing highly efficient thin-film chips. A thin-film chip comprises a thin-film semiconductor body with a semiconductor layer sequence, which can comprise an active region suitable for generating radiation and/or for receiving radiation. For the formation of a thin-film semiconductor body, a substrate on which the semiconductor layer sequence is produced is thinned or removed in regions or completely from the semiconductor layer sequence. For mechanical stabilization, the thin-film semiconductor body can be arranged and in particular fixed on a carrier which the thin-film chip comprises. Said carrier is, accordingly, different from the production substrate. A composite substrate described above and in more detail below is particularly suitable as production substrate in particular for epitaxial growth of the semiconductor layer sequence.

A thin-film light-emitting diode chip can furthermore be distinguished by the following characteristic features:
  a reflective layer is applied or formed at a first main area— facing toward a carrier element—of a radiation-generating epitaxial layer sequence, said layer reflecting at least part of the electromagnetic radiation generated in the epitaxial layer sequence back into the latter;
  the epitaxial layer sequence has a thickness in the region of 20 µm or less, in particular in the region of 10 µm; and/or
  the epitaxial layer sequence contains at least one semiconductor layer with at least one area which has an intermixing structure which ideally leads to an approximately ergodic distribution of the light in the epitaxial layer sequence, that is to say, as far as possible it has an ergodically stochastic scattering behavior.

A basic principle of a thin-film light-emitting diode chip is described, for example in I. Schnitzer et al., Appl. Phys. Lett. 63 (16), Oct. 18, 1993, 2174-2176, the disclosure content of which in this respect is hereby incorporated by reference.

A thin-film light-emitting diode chip is to a good approximation a Lambertian surface emitter and is therefore particularly well-suited to application in a headlight.

A method for producing an optoelectronic semiconductor chip involves firstly providing a composite substrate comprising a substrate body and a utility layer arranged on the substrate body. A semiconductor layer sequence having an active region provided for generating radiation and/or for receiving radiation for the optoelectronic semiconductor chip is deposited, in particular grown, on the utility layer.

Accordingly, the semiconductor layer sequence is deposited on the utility layer of the composite substrate, wherein the utility layer can be distinguished by a high crystal quality. By comparison, a deposition on a homogeneous substrate would be considerably more cost-intensive for comparable crystal quality.

In one preferred development, the composite substrate is thinned or removed in regions or completely. The optoelectronic semiconductor chip can therefore be formed as a thin-film semiconductor chip in which the composite substrate is used as a production substrate for the semiconductor layer sequence. A highly efficient thin-film semiconductor chip can advantageously be fabricated particularly cost-effectively in this way.

BRIEF DESCRIPTION OF THE DRAWINGS

Further features, advantageous configurations and expediencies of the invention will become apparent from the following description of the exemplary embodiments in conjunction with the figures, in which.

DETAILED DESCRIPTION OF THE DRAWINGS

Elements which are identical, of identical type and act identically are provided with identical reference signs in the figures.

Figure 1A:
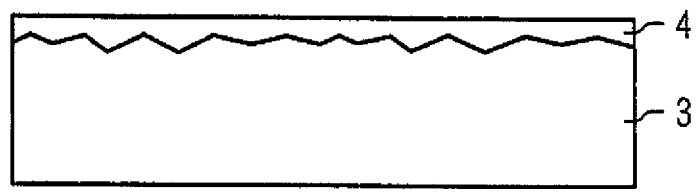
FIGS. 1A to 1C show a first exemplary embodiment of a production method according to the invention for a composite substrate on the basis of the intermediate steps illustrated schematically in sectional view.
Figure 1B:
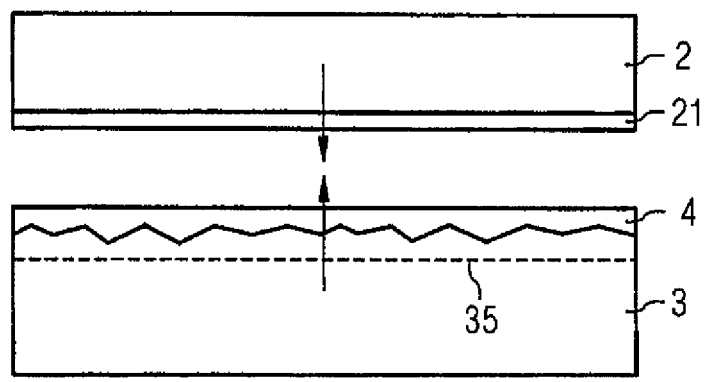
Figure 1C:
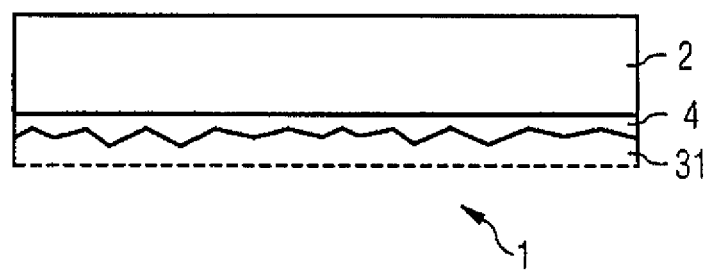

FIGS. 1A to 1C show a first exemplary embodiment of a method according to the invention for producing a composite substrate on the basis of the intermediate steps illustrated schematically in sectional view.

A utility substrate (master substrate) 3 is firstly smoothed. This is shown schematically in FIG. 1A. The smoothing can be effected by means of a planarization layer 4. This planarization layer (smoothing layer) can be produced for example by means of epitaxial overgrowth for instance by means of MOVPE or MBE. Tn particular, the planarization layer can contain a III-V compound semiconductor, for instance a nitride compound semiconductor. By way of example, the planarization layer can be deposited by MOVPE-CaN growth on a Ga-face GaN master substrate. The growth temperature is preferably set in such a way that lateral growth is promoted. By way of example, the growth temperature during the growth of GaN can be 1000-1100° C. This growth temperature can be measured by means of a pyrometer, for example.

Alternatively or additionally, the planarization layer 4 can be produced by means of spinning-on, for example spin-on glass, by means of vapor deposition or sputtering. By way of example, the planarization layer can contain $SiO_2$, $Al_2O_3$, $Si_3N_4$, or Si, or consist of such a material.

The planarization layer 4 can subsequently be more extensively smoothed chemically or mechanically, for example by lapping and/or polishing.

Alternatively or supplementarily, the utility substrate 3 can be smoothed by means of, for example, grinding, lapping, polishing and/or etching.

That surface of the planarization layer 4 which is remote from the utility substrate 3 preferably has a roughness of at most 5 nm, particularly preferably at most 1 nm.

In a subsequent step, optionally an oxide layer can be applied to the surface of the planarization layer 4 or the surface of the planarization layer 4 can be oxidized. The oxide layer or the oxidized planarization layer can serve as a bonding auxiliary layer. A mechanically stable fixing of the utility substrate to the substrate body can thereby be achieved in a simplified manner.

As shown schematically in FIG. 1B, after the planarization, that is to say in particular after the application of the planarization layer 4, a substance can be implanted for producing a separation zone 35 (separation layer or else fracture nucleation layer). By way of example, atoms or ions, for instance H+, HH+ or boron can be implanted. Coimplantation, that is to say the implantation of different ions, can also be used. The separation zone 35 preferably runs parallel or substantially parallel to the surface of the planarization layer.

The implantation is preferably effected through the planarization layer 4. The planarization layer thus produced advantageously can be run in a particularly level fashion.

After the separation zone has been formed, microseparation nuclei can be formed, for example by preliminary heat treatment. For the preliminary heat treatment, preferably the time is chosen to be so short and the temperature is chosen to be so low that first micronuclei form, but as yet no continuous or at least partial fracturing arises.

The utility substrate is subsequently fixed to a substrate body 2. This substrate body, which serves as a secondary substrate, can for example contain sapphire, silicon, SiC, GaAs or GaN or consist of such a material. Preferably, the substrate body is adapted with regard to the thermal expansion constant of the material to that of the master substrate material. The less the expansion constants differ, the lower the risk of the utility layer 31 (see below) being stripped from the substrate body.

A further bonding auxiliary layer 21, for instance a separate oxide layer, is applied to the substrate body 2.

The bonding auxiliary layer and/or if appropriate, the further bonding auxiliary layer can contain an oxide, for example a silicon oxide, such as $SiO_2$, a silicon oxynitride, such as SiON, a TCO material such as ITO (indium tin oxide), ZnO, SnO or $SnO_2$, or consist of such a material. Alternatively the bonding auxiliary layer can, for example contain a nitride, for instance silicon nitride, or consist of such a material.

The fixing of the utility substrate 3 to the substrate body 2 is preferably effected by means of bonding, particularly preferably by means of direct bonding.

A further bonding auxiliary layer 21 is applied on that side of the substrate body 2 which faces the utility substrate. Depending on the substrate body used, this further bonding auxiliary layer can also be dispensed with.

FIG. 1C shows a composite substrate 1 in which the utility substrate 3 has been separated. The master substrate can be separated for example by forming a fracture, preferably by heat treatment. A utility layer 31 remains on the substrate body 2, and a semiconductor layer sequence for example can be deposited epitaxially on said utility layer. That part of the utility substrate which is separated from the substrate body can be used for producing one or a plurality of composite substrates.

That surface of the utility layer 31 which is remote from the substrate body 2 can be perfected for an epitaxial deposition. This surface optimization can be effected for example by incipient etching (for example GaN etching using $H_3PO_4$ or KOH).

Figure 2A:
FIGS. 2A to 2C show a second exemplary embodiment of a production method according to the invention for a composite substrate on the basis of the intermediate steps illustrated schematically in sectional view.
Figure 2B:
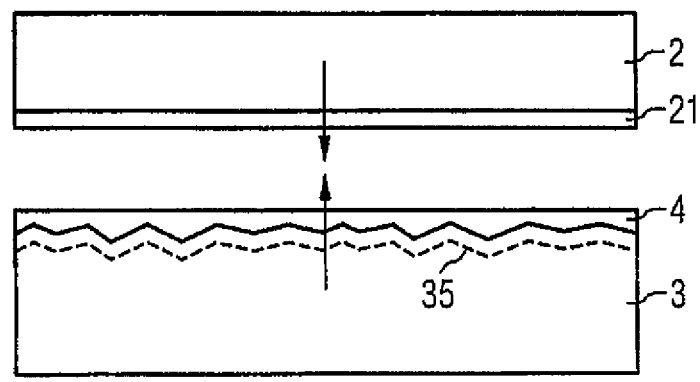
Figure 2C:
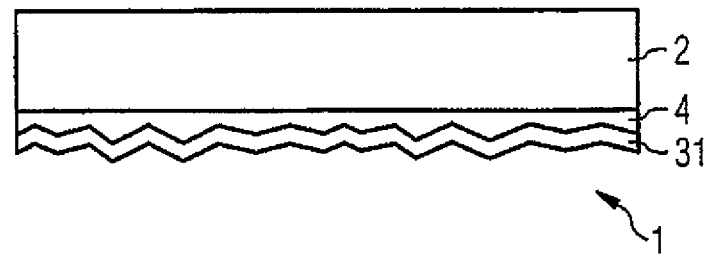

A second exemplary embodiment of a method according to the invention is illustrated in FIGS. 2A to 2C on the basis of intermediate steps illustrated schematically in sectional view.

The second exemplary embodiment essentially corresponds to the first exemplary embodiment described in connection with FIGS. 1A to 1C. In contrast thereto, the separation zone 35 is formed prior to the completion of the planarization layer 4 in the utility substrate 3. This is shown in FIG. 2A.

Steps for smoothing the utility substrate 3, for example smoothing by means of grinding, lapping, polishing or etching, can already be carried out before the separation zone 35 is formed.

If appropriate, it is also possible to deposit an epitaxially deposited partial layer of the planarization layer for smoothing by means of epitaxial overgrowth of the utility substrate before the separation zone is formed. In this second exemplary embodiment, the separation zone follows the surface of the utility substrate, wherein the smoothing of said surface has not yet been fully concluded.

As described in connection with the first exemplary embodiment, that surface of the utility layer 31 which is provided as a deposition area can be optimized, for example leveled, after separation of the utility substrate 3 from the substrate body 2.

Figure 3A:
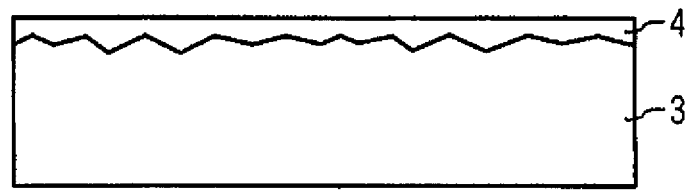
FIGS. 3A to 3C show a third exemplary embodiment of a production method according to the invention for a composite substrate on the basis of the intermediate steps illustrated schematically in sectional view.
Figure 3B:
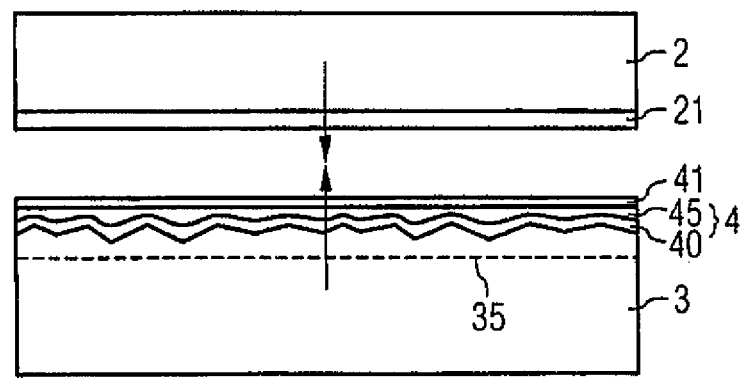
Figure 3C:
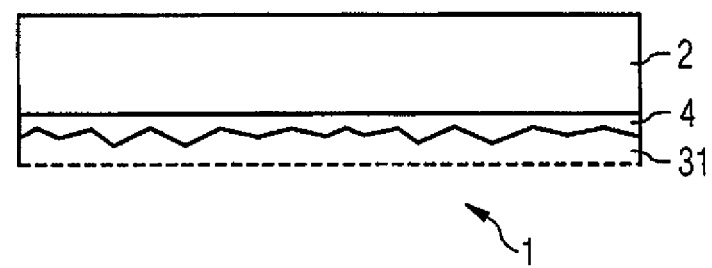

FIGS. 3A to 3C show a third exemplary embodiment of a production method according to the invention for a composite substrate on the basis of the intermediate steps illustrated schematically in sectional view. The third exemplary embodiment essentially corresponds to the first exemplary embodiment, wherein the construction of the planarization layer 4 with a first partial layer 40 and a second partial layer 45 and a bonding auxiliary layer 41 arranged on the planarization layer 4 is illustrated in FIG. 3B.

The first partial layer 40 of the planarization layer 4 is arranged between the utility substrate 3 and the second partial layer 45 of the planarization layer. As described in connection with the first exemplary embodiment for the planarization layer, the first partial layer can be deposited epitaxially on the utility substrate.

The second partial layer 45 can be produced for example by means of spinning-on, sputtering or vapor deposition. The second partial layer 45 of the planarization layer 4 is preferably formed in such a way that it can be mechanically and/or chemically smoothed in a simplified manner in a subsequent step. The second partial layer is furthermore preferably a dielectric layer, particularly preferably an oxide layer or a nitride-containing layer. By way of example, the second partial layer 45 can contain an oxide, for instance a silicon oxide, such as $SiO_2$, a silicon oxynitride, such as SiON, a TCO material, such as TTO (indium tin oxide), ZnO, SnO or $SnO_2$, or silicon nitride, or consist of such a material.

The bonding auxiliary layer 41 is applied on that side of the planarization layer 4 which is remote from the utility substrate 3. The bonding auxiliary layer 41 simplifies a direct bonding connection between the utility substrate 3 and the substrate body 2. In this case, the bonding auxiliary layer 41 and the further bonding auxiliary layer 21 can be mechanically stably fixed to one another by means of atomic forces, wherein the bonding auxiliary layer and the further bonding auxiliary layer directly adjoin one another.

Figure 4A:
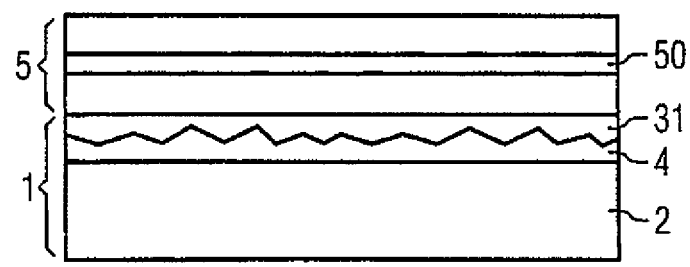
FIGS. 4A to 4C show an exemplary embodiment of a production method for a semiconductor chip on the basis of the intermediate steps illustrated schematically in sectional view.
Figure 4B:
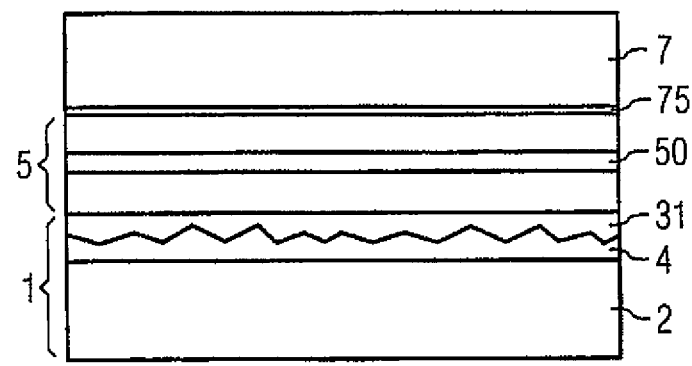
Figure 4C:
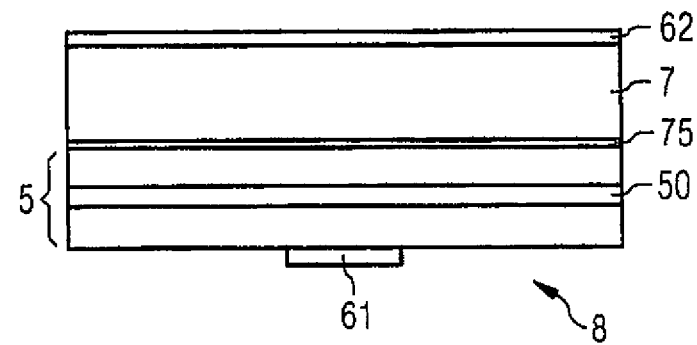

FIGS. 4A to 4C show an exemplary embodiment of a production method for a semiconductor chip on the basis of the intermediate steps illustrated schematically in sectional view. The exemplary embodiment shows the production of a thin-film LED semiconductor chip by way of example. However, the method is also suitable for producing other optoelectronic semiconductor chips, for instance radiation detectors, or else for producing electronic semiconductor chips.

Firstly, a composite substrate is provided, which can be produced in particular as described in connection with the first, second or third exemplary embodiment. As illustrated in FIG. 4A, a semiconductor body having a semiconductor layer sequence 5 is deposited, preferably epitaxially, for instance by means of MOVPE or MBE, on the utility layer 31 of the composite substrate 1. The semiconductor layer sequence 5 comprises an active region 50 provided for generating radiation. Preferably, the semiconductor layer sequence 5, in particular the active region 50, is based on a nitride compound semiconductor, particularly preferably having the material composition $In_xGa_yAl_{1-x-y}N$ where $0 \leq x \leq 1$, $0 \leq y \leq 1$ and $x+y \leq 1$. Nitride compound semiconductors are particularly suitable for generating radiation from the ultraviolet through the blue to the green spectral range. For such a semiconductor chip, the utility layer 31 of the composite substrate 1 is preferably based on GaN.

A carrier 7 is fixed on that side of the semiconductor body 5 which is remote from the composite substrate 1 (see FIG. 4B). The fixing is preferably effected by means of eutectic bonding, wherein a mechanically stable connection is produced by means of the connection layer 75. The connection layer preferably contains a metal, for instance Au, Ag, Cu, Al, Ni or Pt, a metallic alloy containing at least one of the aforementioned metals, or a solder, which can contain for example Au and/or Sn. Alternatively, the semiconductor body can also be fixed to the carrier by means of adhesive bonding. In this case, the connection layer expediently contains a, preferably electrically conductive, adhesive.

The carrier 7 is therefore different from the growth substrate for the semiconductor layer sequence 5 and therefore does not have to meet the stringent requirements imposed on a growth substrate, in particular with regard to the crystal line purity. Rather, the carrier can be chosen according to other criteria, for instance electrical or thermal conductivity, or mechanical stability. The carrier can for example contain Ge, Si, sapphire, GaAs, CaN or SiC or consist of such a material.

FIG. 4C shows a completed thin-film LED semiconductor chip 8, in which the composite substrate, that is to say the growth substrate, has been completely removed. The composite substrate can be removed for example by means of a laser separation method, for instance by means of laser liftoff. In a departure from this, however, the growth substrate can also be thinned or removed only in regions.

A composite substrate can be distinguished by comparison with a GaN substrate, for example, firstly by lower costs and secondly by an improved separability from the semiconductor layer sequence. In comparison with a sapphire substrate, it is possible to deposit semiconductor layers with improved crystal quality on a composite substrate. A composite substrate is therefore particularly suitable for producing a thin-film semiconductor chip.

A contact 61 is arranged on that side of the semiconductor body 5 which is remote from the carrier 7. A further contact 62 is arranged on that side of the carrier which is remote from the semiconductor body 5. During operation of the semiconductor chip, an electric current can be impressed into the semiconductor body via the contacts 61 and 62. Charge carriers injected into the semiconductor body in this way can recombine in the active region 50 with emission of radiation.

The contact 61 and/or the contact 62 can be produced for example by means of vapor deposition or sputtering. Preferably, the contacts contain a metal, for instance Au, Ag, Cu, Al, Ni, Ti or Pt and/or a TCO material, for instance ITO or ZnO. Furthermore, the contact and/or the further contact can also be formed in multilayer fashion.

Figure 5:
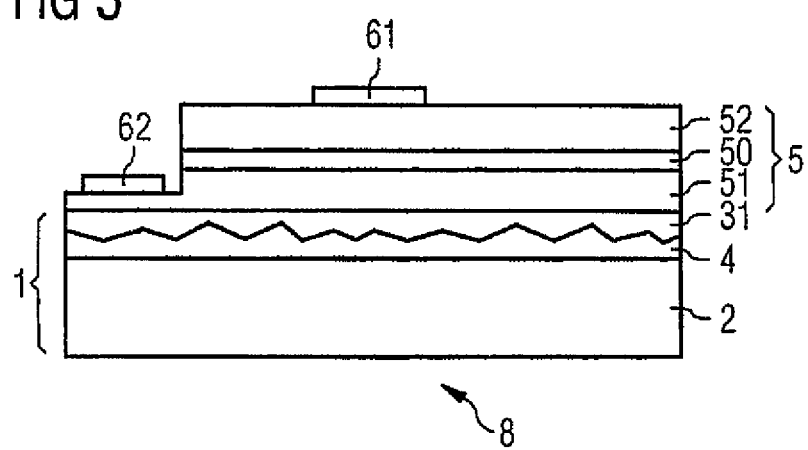
FIG. 5 shows an exemplary embodiment of a semiconductor chip comprising a composite substrate according to the invention.

An exemplary embodiment of a semiconductor chip comprising a composite substrate according to the invention is shown in FIG. 5. The composite substrate can be produced and embodied in particular as described in connection with the first, second or third exemplary embodiment. A semiconductor body with a semiconductor layer sequence 5 is arranged on that side of the utility layer 31 which is remote from the substrate body 2.

The active region 50 is arranged between a first semiconductor layer 51 and a second semiconductor layer 52. The first semiconductor layer is situated between the active region and the composite substrate 1. A first contact 61 is arranged on that side of the second semiconductor layer 52 which is remote from the active region 50.

The first semiconductor layer 51 is uncovered in regions from that side of the semiconductor body 5 which is remote from the composite substrate 1. A further contact 62 is arranged in the uncovered region. The contact-connection of the semiconductor chip 8 is therefore effected from a side of the semiconductor chip. In a departure from this, the second contact can also be arranged on that side of the substrate body 2 which is remote from the semiconductor body 5. In this case, the composite substrate 1 is expediently embodied in electrically conductive fashion.

The semiconductor layer sequence 5 and the contacts 61 and 62 can be embodied as described in connection with FIGS. 4A to 4C. In contrast to the semiconductor chip shown in FIG. 4C, the semiconductor layer sequence remains on the growth substrate, that is to say the composite substrate 1. The substrate body 2 of the composite substrate is preferably formed such that it is transmissive, for instance transparent or translucent, to radiation generated in the active region 50 during the operation of the semiconductor chip. For this purpose, sapphire, for example, is suitable as material for the substrate body. The radiation can therefore also emerge from the semiconductor chip 8 through the substrate body 2.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A composite substrate comprising:
    a substrate body;
    a utility layer fixed on the substrate body; and
    a planarization layer arranged between the utility layer and the substrate body;
    wherein a surface of the planarization layer which is remote from the utility layer has a roughness of at most 5 nm,
    wherein the composite substrate is adapted for epitaxial deposition of a semiconductor layer or of a semiconductor layer sequence on a side of the utility layer that faces away from the substrate body, and
    wherein the utility layer has a thickness less than a thickness of the substrate body.

2. The composite substrate as claimed in claim 1, comprising a bonding connection between the substrate body and the planarization layer.

3. The composite substrate as claimed in claim 1, wherein the planarization layer is an epitaxially-grown layer on the utility layer.

4. The composite substrate as claimed in claim 1, wherein the planarization layer is dielectric.

5. The composite substrate as claimed in claim 1, wherein the planarization layer comprises at least two partial layers.

6. The composite substrate as claimed in claim 5, wherein at least one partial layer of the planarization layer is an epitaxially-grown layer, and at least one further partial layer of the planarization layer is dielectric.

7. The composite substrate as claimed in claim 1, wherein a bonding auxiliary layer is arranged between the utility layer and the substrate body.

8. The composite substrate as claimed in claim 7, wherein the bonding auxiliary layer is an oxide layer.

9. The composite substrate as claimed in claim 7, wherein the planarization layer is a bonding auxiliary layer.

10. The composite substrate as claimed in claim 7, wherein the bonding auxiliary layer is arranged between the substrate body and the planarization layer.

11. An optoelectronic semiconductor chip comprising a composite substrate as claimed in claim 1, wherein a semiconductor layer sequence comprising an active region suitable for generating radiation and/or for receiving radiation is arranged on the composite substrate.

12. An electronic semiconductor chip comprising a composite substrate as claimed in claim 1, wherein a semiconductor layer or a semiconductor layer sequence for an electronic component or for an electronic circuit is arranged on the composite substrate.

13. The composite substrate as claimed in claim 1, wherein the utility layer comprises GaN.

14. The composite substrate as claimed in claim 1, wherein a surface of the utility layer is tilted relative to a plane defined by principle crystal directions.

15. The composite substrate as claimed in claim 1, wherein the planarization layer comprises silicon.

16. The composite substrate as claimed in claim 1, wherein the planarization layer consists of silicon.

17. The composite substrate as claimed in claim 1, wherein the surface of the planarization layer which is remote from the utility layer has a roughness of at most 1 nm.

18. The composite substrate as claimed in claim 1, wherein the utility layer is fixed on the substrate body by direct bonding.

19. The composite substrate as claimed in claim 1, wherein the surface of the planarization layer which faces the substrate body has a lower roughness than a surface of the utility layer which faces the substrate.

20. A composite substrate, comprising:
a substrate body;
a utility layer fixed on the substrate body; and
a planarization layer arranged between the utility layer and the substrate body,
wherein a surface of the planarization layer which is remote from the utility layer has a roughness of at most 5 nm,
wherein the utility layer comprises GaN,
wherein a bonding auxiliary layer is arranged between the utility layer and the substrate body, said bonding auxiliary layer being an oxide layer,
wherein a surface of the planarization layer which faces the substrate body has a lower roughness than a surface of the utility layer which faces the substrate body,
wherein the composite substrate is adapted for epitaxial deposition of a semiconductor layer or of a semiconductor layer sequence on a side of the utility layer that faces away from the substrate body, and
wherein the utility layer has a thickness less than a thickness of the substrate body.

21. The composite substrate as claimed in claim 20, wherein the planarization layer consists of silicon.

* * * * *